US007215717B2

(12) United States Patent
Doi

(10) Patent No.: US 7,215,717 B2
(45) Date of Patent: May 8, 2007

(54) DISTORTION COMPENSATION CIRCUIT

(75) Inventor: Yoshiaki Doi, Tokyo (JP)

(73) Assignee: NEC Corporation, Tokyo (JP)

( * ) Notice: Subject to any disclaimer, the term of this patent is extended or adjusted under 35 U.S.C. 154(b) by 741 days.

(21) Appl. No.: 10/321,533

(22) Filed: Dec. 18, 2002

(65) Prior Publication Data

US 2003/0118125 A1 Jun. 26, 2003

(30) Foreign Application Priority Data

Dec. 21, 2001 (JP) ............................. 2001-389740

(51) Int. Cl.
*H04K 1/02* (2006.01)
*H04L 25/03* (2006.01)
*H04L 25/49* (2006.01)

(52) U.S. Cl. ...................... 375/297; 375/296; 375/295; 375/254; 375/285

(58) Field of Classification Search ................ 375/297, 375/296, 295, 254, 285
See application file for complete search history.

(56) References Cited

U.S. PATENT DOCUMENTS

| 4,700,151 A | * | 10/1987 | Nagata ........................ 332/123 |
| 5,396,190 A |   | 3/1995  | Murata |
| 2001/0007435 A1 | * | 7/2001 | Ode et al. .................... 330/149 |

FOREIGN PATENT DOCUMENTS

| EP | 1 322 034 A1 | 6/2003 |
| JP | 03-270306 A  | 12/1991 |
| JP | 6-310946     | 11/1994 |
| JP | 8-78967 A    | 3/1996 |
| JP | 8-251246 A   | 9/1996 |
| JP | 2001-251148 A | 9/2001 |
| JP | 2001-345718 A | 12/2001 |
| JP | 2003-142959 A | 5/2003 |
| WO | WO 01/80471 A2 | 10/2001 |

OTHER PUBLICATIONS

Error Sensitivity in Adaptive Predistortion Systems, Paolo Banelli.

* cited by examiner

*Primary Examiner*—Chieh M. Fan
*Assistant Examiner*—Anna Ziskind
(74) *Attorney, Agent, or Firm*—Sughrue Mion, PLLC

(57) ABSTRACT

Disclosed is a distortion compensation circuit that reduces the time for convergence of distortion compensation data, without impairing any stability of distortion compensation. The circuit includes an error computation and compensation data updating section that repeats a computation in which errors between an input orthogonal baseband transmission signal and a feedback signal obtained by demodulating part of the output from a power amplifier are computed to obtain error data and values obtained by multiplying this error data by step coefficients are added to distortion compensation data before updating, thereby computing distortion compensation data after updating. Distortion compensation data for compensation of nonlinear distortion is thus updated. Step coefficients are stored in a step coefficient data memory with respect to each of different input signal amplitude values. Step coefficients corresponding to an input signal amplitude value computed by an amplitude computation section are output from the memory to multipliers.

12 Claims, 9 Drawing Sheets

DISTORTION COMPENSATION CIRCUIT

BACKGROUND OF THE INVENTION

1. Field of the Invention

The present invention relates to a distortion compensation circuit which is used in a wireless transmitting apparatus such as a base station in a wireless communication system to make compensation for a distortion caused in amplification means such as a power amplifier which amplifies an input signal.

2. Description of the Related Art

In a wireless transmitting apparatus in a wireless communication system, it is ideal to use a power amplifier having linearity with respect to all amplitude components in order to minimize adjacent-channel-leakage power as small as possible. A power amplifier having good linearity with respect to a wide amplitude component range, however, is large in scale and high-priced and has large power consumption. In some case, therefore, there is no way other than a power amplifier having nonlinearity with respect to large-amplitude components while having good linearity with respect to small-amplitude components. If an amplitude component of a power level higher than the mean power level is amplified by using such a power amplifier, adjacent-channel-leakage power is increased.

Then, various distortion compensation techniques have been proposed for the purpose of reducing adjacent-channel-leakage power due to nonlinearity of power amplification means. Typical examples of such distortion compensation techniques are feedforward method, Cartesian feedback method, and the predistortion method. It is difficult to improve the efficiency of an amplification system using the feedforward method because of the need for an error amplifier. Recently, distortion compensation made by the Cartesian feedback method or the predistortion method capable of distortion compensation in a base band on a digital orthogonal coordinate system has been studied from the viewpoint of achieving cost-reduction and efficiency-improvement effects. (See, for example, Japanese Patent Laid-open Nos. 8-78967 and 8-251246).

In the Cartesian feedback method, however, the amount of improvement in distortion is proportional to the loop gain and it is, therefore, difficult to increase the bandwidth in which a distortion improvement effect can be achieved in increasing the distortion improvement effect and maintaining the loop stability in feedback. In a mobile communication system, therefore, the predistortion method capable of increasing the bandwidth is effectively used. A description will be given of the predistortion method.

FIG. 9 is a block diagram showing an example of a configuration of a wireless transmitting apparatus having a conventional predistortion-type distortion compensation circuit. This wireless transmitting apparatus has a transmission data generation unit 1, digital-to-analog (D/A) converters $3_1$ and $3_2$, a quadrature modulator 4, a reference signal generation unit 5, a power amplifier 6, a directional coupler 7, and a distortion compensation circuit 30. The distortion compensation circuit 30 is constituted by a nonlinear distortion compensation computation section 2, a quadrature demodulator 8, an analog-to-digital (A/D) converters $9_1$ and $9_2$, an amplitude computation section 10, and an error computation and compensation data updating section 91.

The nonlinear distortion compensation computation section 2 performs computation for distortion compensation on digital orthogonal baseband transmission signals I and Q from the transmission data generation unit 1 by performing complex multiplication of these signals on the basis of distortion compensation data (amplitude compensation data K and phase compensation data θ). Orthogonal baseband transmission signals I' and Q' after distortion compensation computation are converted into analog orthogonal baseband signals by the D/A converters $3_1$ and $3_2$. The quadrature modulator 4 modulates the analog orthogonal baseband signals into a orthogonally modulated signal with a signal from the reference signal generation unit 5. The orthogonally modulated signal is power amplified by the power amplifier 6 to be output as a radio frequency (RF) output.

Part of the output from the power amplifier 6 is fed back to the quadrature demodulator 8 by the directional coupler 7 to be demodulated into analog orthogonal baseband signals with the signal from the reference signal generation unit 5. The analog orthogonal baseband signals are converted into digital orthogonal baseband signals I" and Q" by the A/D converters $9_1$ and $9_2$. The error computation and compensation data updating section 91 updates the distortion compensation data by comparing the feedback digital orthogonal baseband signals I" and Q" and the orthogonal baseband signals I and Q from the transmission data generation unit 1 and using as an address an amplitude value from the amplitude computation section 10. The nonlinear distortion compensation computation section 2 makes distortion compensation on the basis of the updated distortion compensation data.

In the arrangement shown in FIG. 9 as an example of a predistortion-type distortion compensation circuit, a power value which is the second power of the amplitude value may be used as an address instead of the amplitude value from the amplitude computation section 10.

FIG. 10 shows a configuration of the error computation and compensation data updating section 91 shown in FIG. 9. As shown in FIG. 10. the error computation and compensation data updating section 91 is constituted by an error computation section 12, an error compensation data memory 13, a distortion compensation data memory 14, multipliers $21_1$ and $21_2$, and adders $22_1$ and $22_2$.

The error computation and compensation data updating section 91 repeats a computation in which errors between orthogonal baseband signals I and Q, which are input signals, and orthogonal baseband signals I" and Q", which are obtained by demodulating part of the output from the power amplifier 6, are computed to obtain error data and values obtained by multiplying this error data by step coefficients α and β are added to the distortion compensation data (amplitude compensation data $K_n$ and phase compensation data $\theta_n$) before updating, thereby computing new distortion compensation data (amplitude compensation data $K_{n+1}$ and phase compensation data $\theta_{n+1}$). In this manner, the distortion compensation data for compensation for nonlinear distortion is updated.

Since the distortion compensation data varies depending on the amplitude value of the input signals, the distortion compensation data corresponding to a certain amplitude value is updated only when the amplitude value of the input signals becomes equal to the certain amplitude value. In the following description, if the number of times the distortion compensation data corresponding to the certain amplitude value is updated (referred to) is n, the amplitude value of the input signals when it becomes equal to the certain amplitude value at the nth time is expressed as $r_n$.

The error computation section 12 compares the input signals I and Q having the amplitude value $r_n$ and the feedback signals I" and Q" on a polar coordinate system, thereby computes an amplitude error $E_a(r_n)$ and a phase error Ep($r_n$), also computes a value Ea($r_n$)/$r_n$ by dividing the amplitude error Ea($r_n$) by the amplitude value $r_n$ of the input signals, and outputs the computed errors and the value Ea($r_n$)/$r_n$ as error data to the error compensation data memory 13.

The error compensation data memory 13 is a rewritable memory for temporarily storing error data computed by the error computation section 12 by using as an address the amplitude value $r_n$ computed by the amplitude computation section 10.

The multiplier $21_1$ performs a computation which is multiplication of the phase error Ep($r_n$) from the error compensation data memory 13 by the predetermined step coefficient β, and outputs the result of this computation. The multiplier $21_2$ performs a computation in which the value Ea($r_n$)/$r_n$ from the error compensation data memory 13, i.e., the value obtained by dividing the amplitude error Ea($r_n$) by the amplitude value $r_n$, is multiplied by the predetermined step coefficient α, and outputs the result of this computation.

The adder $22_1$ performs a computation in which phase compensation data $θ_n$ before updating, output from the distortion compensation data memory 14, is added to the result of computation from the multiplier $21_1$, and outputs the result of this computation to the distortion compensation data memory 14 as phase compensation data $θ_{n+1}$ after updating. The adder $22_2$ performs a computation in which amplitude compensation data $K_n$ before updating, output from the distortion compensation data memory 14, is added to the result of computation from the multiplier $21_2$, and outputs the result of this computation to the distortion compensation data memory 14 as amplitude compensation data $K_{n+1}$ after updating.

The distortion compensation data memory 14 outputs to the nonlinear distortion compensation computation section 2 amplitude compensation data $K_n$ and phase compensation data $θ_n$ corresponding to the amplitude value $r_n$ from the amplitude computation section 10, and newly stores, as compensation data corresponding to the amplitude value $r_n$ of the input signals, distortion compensation data (amplitude compensation data $K_{n+1}$ and phase compensation data $θ_{n+1}$) after updating from the adders $22_1$ and $22_2$.

The operation of the error computation and compensation data updating section 91 in this conventional distortion compensation circuit 30 will be described with reference to FIG. 10.

It is assumed that the amplitude of the input signals at a certain point in time is $r_n$ and amplitude compensation data and phase compensation data which are distortion compensation data corresponding to the amplitude value $r_n$ and which is stored in the distortion compensation data memory 14 at the corresponding time are $K_n$ and $θ_n$, respectively. The error computation section 12 compares input signals I and Q having the amplitude value $r_n$ and feedback signals I" and Q" on the polar coordinate system, thereby computes amplitude error Ea($r_n$) and phase error Ep($r_n$), and also computes Ea($r_n$)/$r_n$. This error data is temporarily stored in the rewritable error compensation data memory 13 with $r_n$ used as an address.

If the amplitude value of the input signals at the next time when it becomes equal to $r_n$ is $r_{n+1}$, amplitude compensation data $K_{n+1}$ and phase compensation data $θ_{n+1}$ corresponding to the amplitude value $r_{n+1}$ are obtained by the multipliers $21_1$ and $21_2$ and the adders $22_1$ and $22_2$ performing the following repeated computation processing by referring to amplitude compensation data $K_n$ and phase compensation data $θ_n$ stored in the distortion compensation data memory 14 using the amplitude value $r_n$ as an address.

$$K_{n+1}=K_n+α·\{Ea(r_n)/r_n\}$$

$$θ_{n+1}=θ_n+β·Ep(r_n) \quad (1)$$

The distortion compensation data in the rewritable distortion compensation data memory 14 is updated to the distortion compensation data obtained by the above-described processing with the amplitude value as an address, and the nonlinear distortion compensation computation section 2 shown in FIG. 9 performs complex multiplication on the basis of the distortion compensation data updated at successive times, thus realizing adaptive distortion compensation control.

Each of the multiplication coefficient α in the repeated computation processing on amplitude compensation data by the equation (1) shown above and the multiplication coefficient β in the repeated computation processing on phase compensation data is a step coefficient in repeated computation independent of the convergence value and having an influence on the convergence time and stability. Ordinarily, a certain fixed value is used as the multiplication coefficient.

If each step coefficient is set to a smaller value, the convergence time before the completion of convergence of distortion compensation data to the optimum value is increased, as shown in FIG. 11A. However, if each step coefficient is set to a larger value for the purpose of reducing the convergence time, distortion compensation data vibrates instead of converging with stability, as shown in FIG. 11B. In setting the step coefficients, therefore, values selected as the step coefficients are optimized by considering the convergence time and stability. However, the optimum values vary depending on the amplitude of the input signals. In the conventional distortion compensation circuit, the step coefficients in repeated computation for obtaining distortion compensation data are set constant regardless of the magnitude of the amplitude value of the input signals and, therefore, are not necessary optimum values with respect to some amplitude value when they are optimum with respect to another amplitude value. Consequently, it is not possible to achieve a reduction in convergence time while improving the stability of distortion compensation with respect to all amplitude values.

As described above, the conventional distortion compensation circuit has a problem in that, since the step coefficients in repeated computation for obtaining distortion compensation data are set to constant values regardless of the amplitude value of input signals, it is not possible to reduce the convergence time while maintaining the stability of distortion compensation.

SUMMARY OF THE INVENTION

An object of the present invention is to provide a distortion compensation circuit capable of reducing a convergence time before a completion of convergence of distortion compensation data without impairing any stability of distortion compensation.

To attain the above-described object, according to the present invention, there is provided a distortion compensation circuit for making compensation for a distortion caused in amplification means for amplifying an orthogonal baseband transmission signal, including an amplitude computation section which computes an amplitude value of the orthogonal baseband signal, an error computation and compensation data updating section which updates distortion compensation data in such a manner that an error computation is performed to obtain an error between the orthogonal baseband transmission signal and a feedback orthogonal baseband signal obtained by demodulating part of an output from the amplification means, and new distortion compensation data is computed by adding, to distortion compensation data before updating, a value obtained by multiplying the error data obtained as a result of the error computation by a step coefficient, and a nonlinear distortion compensation computation section which makes distortion compensation on the orthogonal baseband transmission signal on the basis of the distortion compensation data from the error computation and compensation data updating section, wherein the error computation and compensation data updating section has step coefficient changing means for changing the step coefficient according to the amplitude value computed by the amplitude computation section.

According to the present invention, in the error computation and compensation data updating section, step coefficients by which an amplitude error and a phase error computed by comparing the demodulated feedback orthogonal baseband signal and the input orthogonal baseband transmission signal on a polar coordinate system are multiplied are changed according to the amplitude value of the orthogonal baseband transmission signal. Updating of compensation data up to a component of a large input signal amplitude with which only a small number of error data samples are obtained can therefore be performed in a shorter time. The time before the completion of convergence of distortion compensation can be reduced to a large extent and the stability of distortion compensation can be improved.

In the distortion compensation circuit, the step coefficient changing means may be a step coefficient data memory which stores in advance a step coefficient with respect to each of amplitude values, and which outputs the step coefficient corresponding to the amplitude value computed by the amplitude computation section.

In the distortion compensation circuit, the step coefficient changing means may be a step coefficient computation section which computes, by using as a variable the amplitude value computed by the amplitude computation section, a step coefficient corresponding to the amplitude value.

In the distortion compensation circuit, the step coefficient changing means may be constituted by a step coefficient selector which selects one of at least two step coefficients and outputs the selected step coefficient, and an amplitude determination section which controls the selecting operation of the step coefficient selector according to the amplitude value computed by the amplitude computation section.

In the distortion compensation circuit, the error computation and compensation data updating section may have selection means for selecting one of the step coefficient from the step coefficient data memory and a step coefficient set in advance to a value smaller than the step coefficient from the step coefficient data memory, and outputting the selected step coefficient, and change determination means for controlling the selection means so that the selection means selects the step coefficient from the step coefficient data memory before convergence of distortion compensation data and selects the step coefficient set in advance after convergence of distortion compensation data.

In the distortion compensation circuit, the error computation and compensation data updating section may have selection means for selecting one of the step coefficient from the step coefficient computation section and a step coefficient set in advance to a value smaller than the step coefficient from the step coefficient computation section, and outputting the selected step coefficient, and change determination means for controlling the selection means so that the selection means selects the step coefficient from the step coefficient computation section before convergence of distortion compensation data and selects the step coefficient set in advance after convergence of distortion compensation data.

In the distortion compensation circuit, the error computation and compensation data updating section may have selection means for selecting one of the step coefficient from the step coefficient selector and a step coefficient set in advance to a value smaller than the step coefficient from the step coefficient selector, and outputting the selected step coefficient, and change determination means for controlling the selection means so that the selection means selects the step coefficient from the step coefficient selector before convergence of distortion compensation data and selects the step coefficient set in advance after convergence of distortion compensation data.

In the distortion compensation circuit, the change determination means may determine that distortion compensation data has converged after a lapse of a certain time period from initialization or when a temperature equilibrium is reached.

According to the present invention, the step coefficient changed according to the amplitude value of the orthogonal baseband transmission signal is changed to a smaller step coefficient to further improve the stability of distortion compensation after convergence of distortion compensation data.

DETAILED DESCRIPTION OF THE PREFERRED EMBODIMENTS

Embodiments of the present invention will be described in detail with reference to the accompanying drawings.

Figure 9:
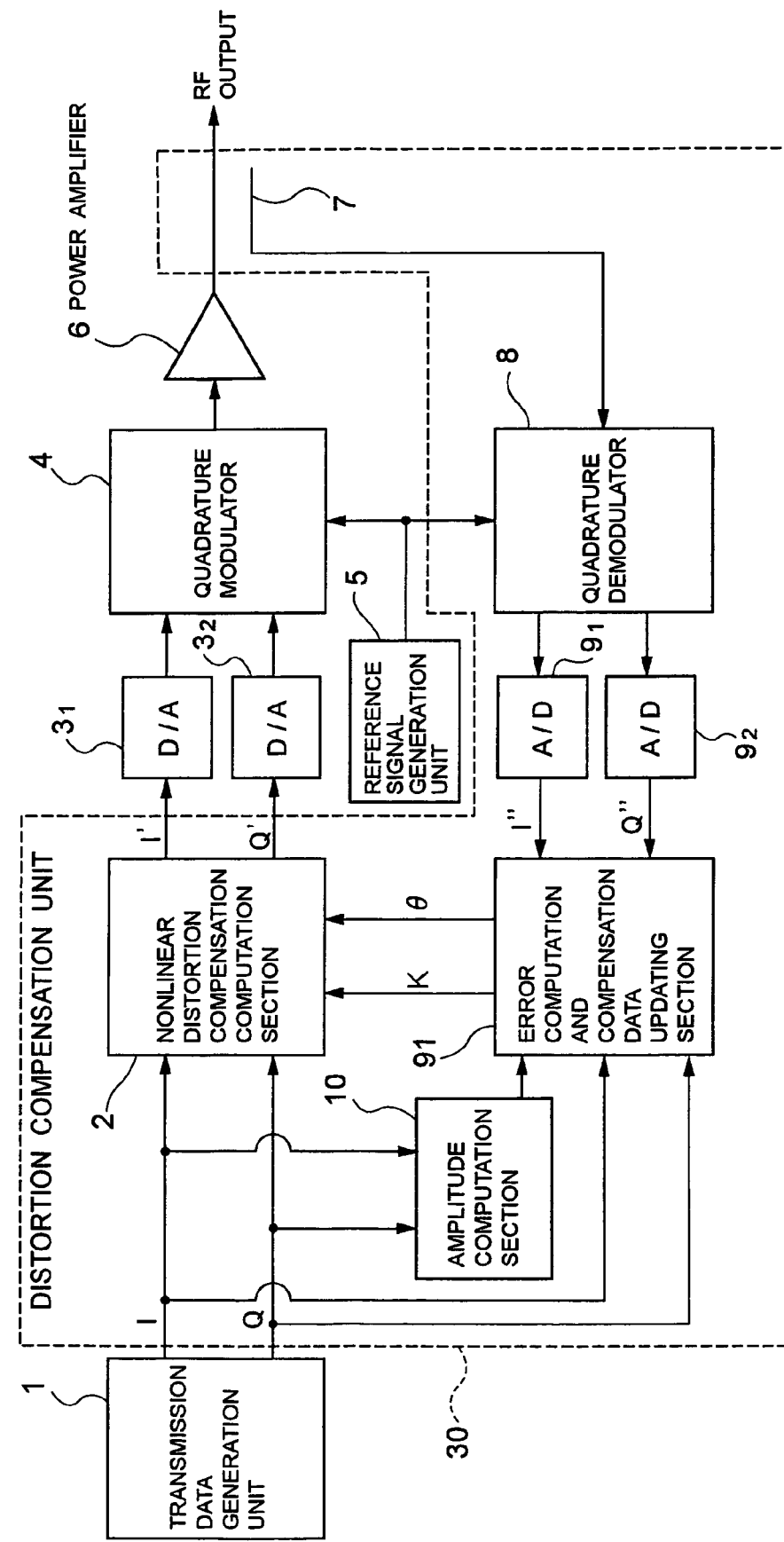
FIG. 9 is a block diagram showing a configuration of a wireless transmitting apparatus having a conventional predistortion-type distortion compensation circuit.

A distortion compensation circuit according to a first embodiment of the present invention will first be described. The distortion compensation circuit according to the first embodiment of the present invention is arranged in such a manner that an error computation and compensation data updating section 91 in the distortion compensation circuit shown in FIG. 9 is replaced with an error computation and compensation data updating section $11_1$ shown in FIG. 1.

Figure 1:
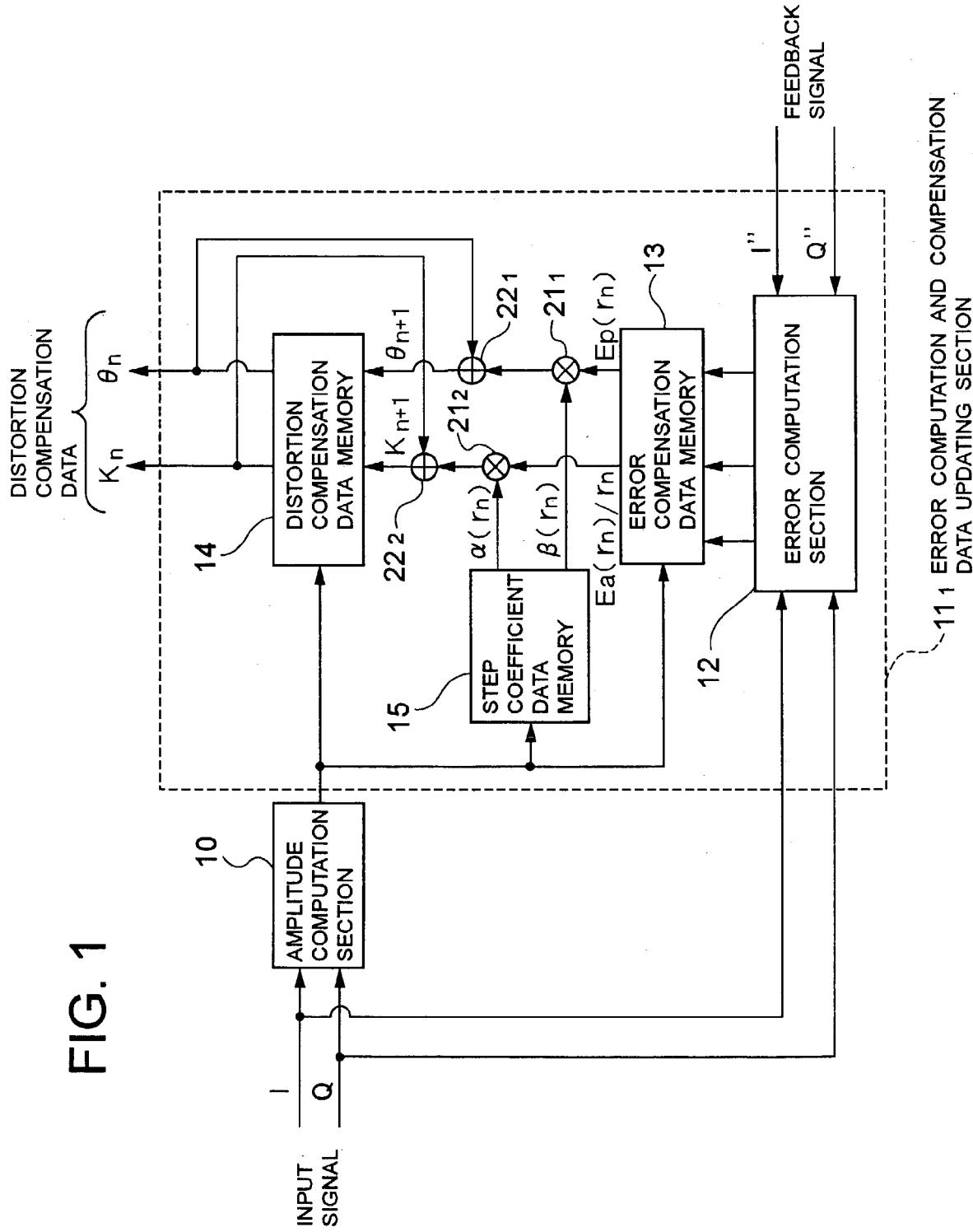
FIG. 1 is a block diagram showing a configuration of an error computation and compensation data updating section $11_1$ in a distortion compensation circuit according to a first embodiment of the present invention.
Figure 10:
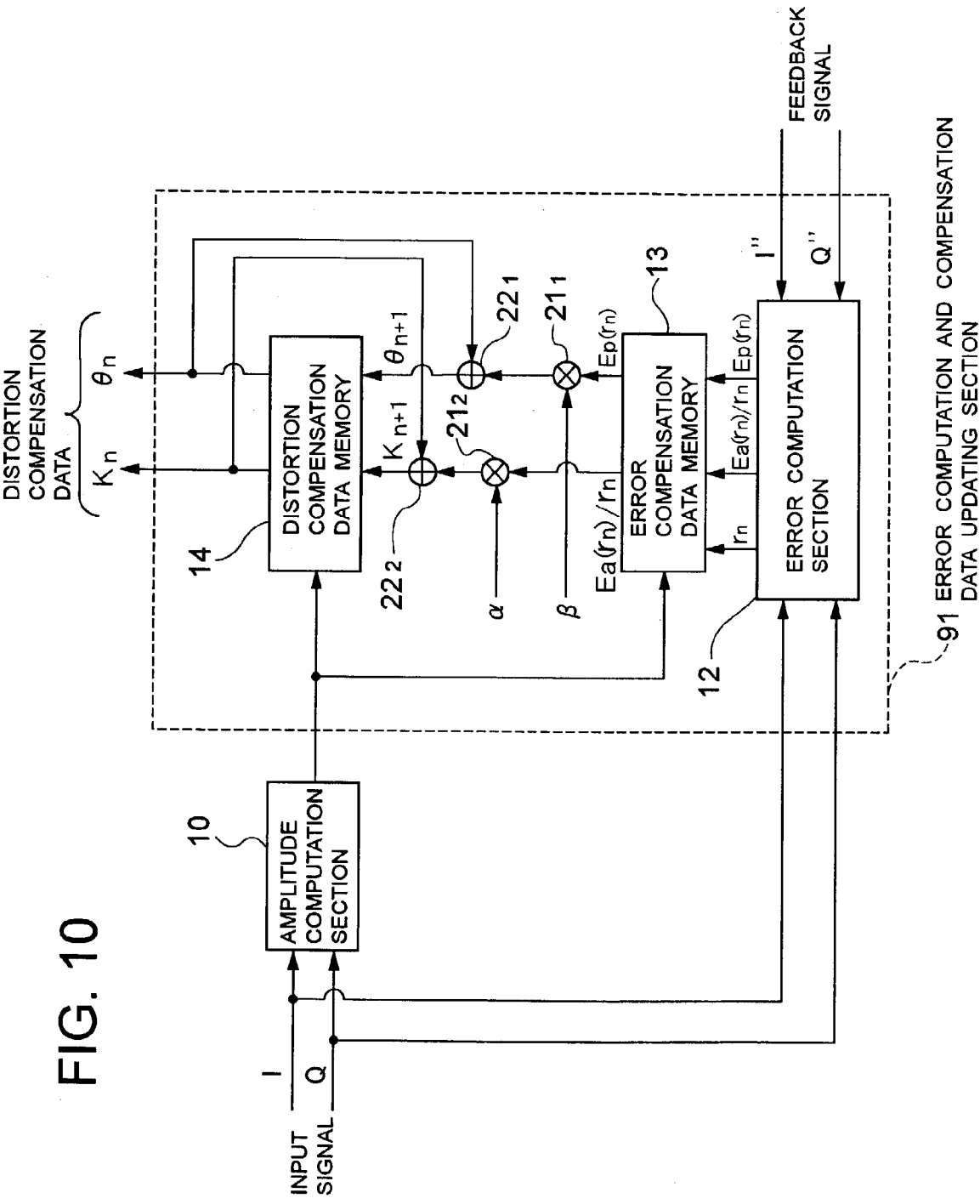
FIG. 10 is a block diagram showing a configuration of an error computation and compensation data updating section 91 shown in FIG. 9.
Figure 11A:
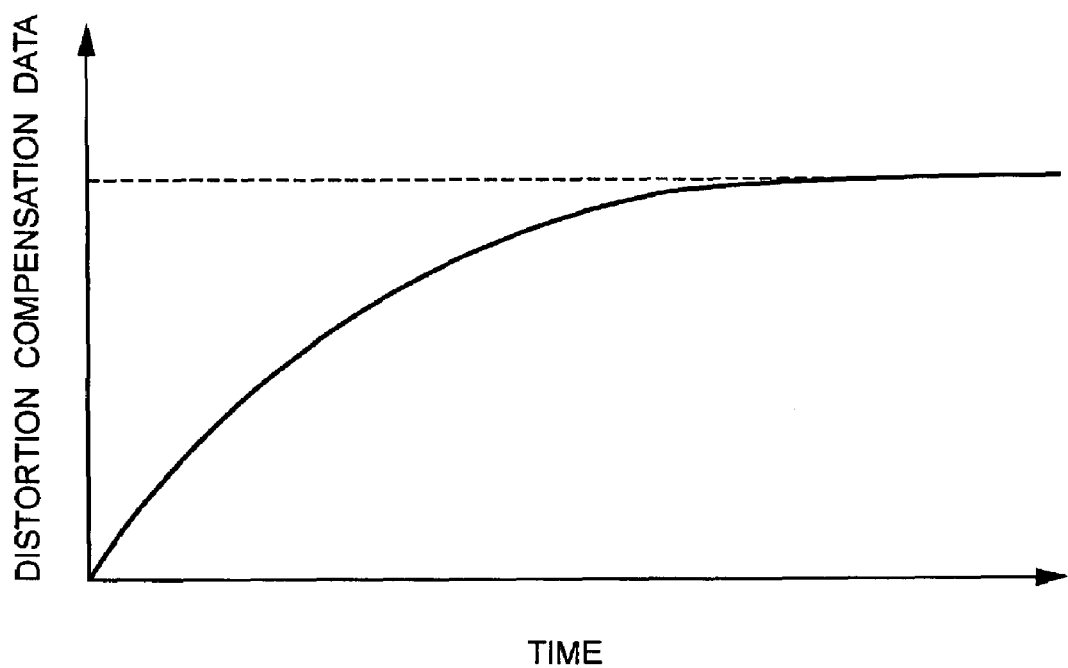
FIG. 11A is a diagram showing change in distortion compensation data when the data converges to an optimum value in a case where a small value is set as a step coefficient.
Figure 11B:
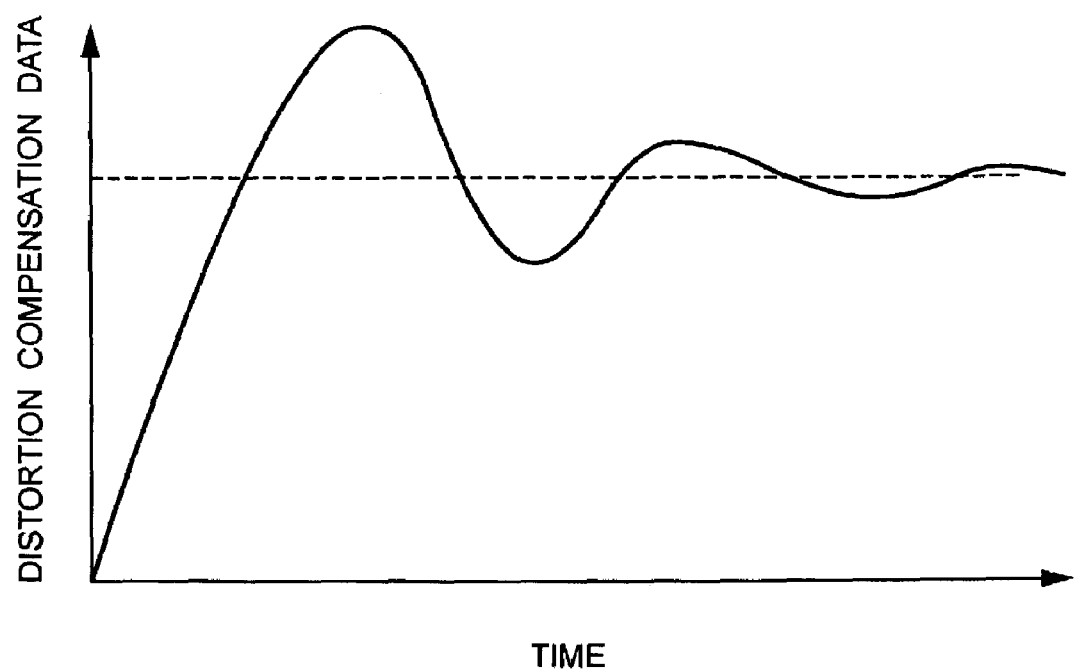
FIG. 11B is a diagram showing change in distortion compensation data when the data converges to an optimum value in a case where a large value is set as a step coefficient.

The error computation and compensation data updating section $11_1$ differs from the error computation and compensation data updating section 91 shown in FIG. 10 in that the former has a step coefficient data memory 15. In FIG. 1, components identical or corresponding to those shown in FIG. 10 are indicated by the same reference characters.

In the step coefficient data memory 15, a step coefficient α for amplitude compensation data and a step coefficient β for phase compensation data are stored with respect to each of different amplitude values of input signals. Step coefficients $α(r_n)$ and $β(r_n)$ corresponding to the input signal amplitude value $r_n$ computed by the amplitude computation section 10 are output from the step coefficient data memory 15 to the multipliers $21_1$ and $21_2$.

The multiplier $21_1$ performs a computation which is multiplication of phase error $Ep(r_n)$ from the error compensation data memory 13 by the step coefficient $β(r_n)$ output from the step coefficient data memory 15, and outputs the result of this computation. The multiplier $21_2$ performs a computation in which the value $Ea(r_n)/r_n$ from the error compensation data memory 13, i.e., the value obtained by dividing the amplitude error $Ea(r_n)$ by the amplitude value $r_n$, is multiplied by the step coefficient $α(r_n)$ output from the step coefficient data memory 15, and outputs the result of this computation.

When the input signal amplitude value computed by the amplitude computation section 10 is $r_n$, error data (amplitude error $Ea(r_n)$ and phase error $Ep(r_n)$) computed in the error computation section 12 is stored in the rewritable error compensation data memory 13 with the amplitude value $r_n$ from the amplitude computation section 10 used as an address. The step coefficients α and β used in repeated computation processing (see equation (1)) performed by the multipliers $21_1$ and $21_2$ and the adders $22_1$ and $22_2$ when amplitude compensation data $K_n$ and phase compensation data $θ_n$ in the distortion compensation data memory 14 are updated to amplitude compensation data $K_{n+1}$ and phase compensation data $θ_{n+1}$ used in computation for distortion compensation at the next time when the input signal amplitude value becomes $r_n$ are not fixed values. At this time, the step coefficients $α(r_n)$ and $β(r_n)$ are used, which are output from the step coefficient data memory 15 with the amplitude $r_n$ from the amplitude computation section 10 used as an address.

Computation for distortion compensation on digital orthogonal baseband signals I and Q, which are input signals, is performed in the same manner as that in the conventional distortion compensation circuit shown in FIG. 9. The step coefficients $α(r_n)$ and $β(r_n)$ stored in the step coefficient data memory 15 in correspondence with the amplitude value $r_n$ are set to optimum values which are selected with respect to the input signal amplitude value $r_n$ to reduce the convergence time and to improve the stability, as described below.

Analysis of the effectiveness of this embodiment will be described with reference to FIGS. 2 and 3. Distortion compensation data comprises amplitude compensation data and phase compensation data, as described above. However, a simplified description will be made by considering only amplitude compensation characterized by a large difference between compensation data in an initial state when no compensation is made and compensation data after convergence and by large influence on the convergence time.

A multiplexed wave such as a wave modulated by a code division multiple access method in a digital mobile communication system can be approximated to a Gaussian noise. It can be assumed that Gaussian noise of a narrow band is formed by random amplitude-modulated waves, and that its envelop is a Rayleigh distribution. Its envelop function (probability density function) can be expressed as shown below.

$$p(R)=(R/σ^2)·\exp(-R^2/2σ^2)$$

where R is the envelop voltage and $2σ^2$ is the mean power value.

Figure 2:
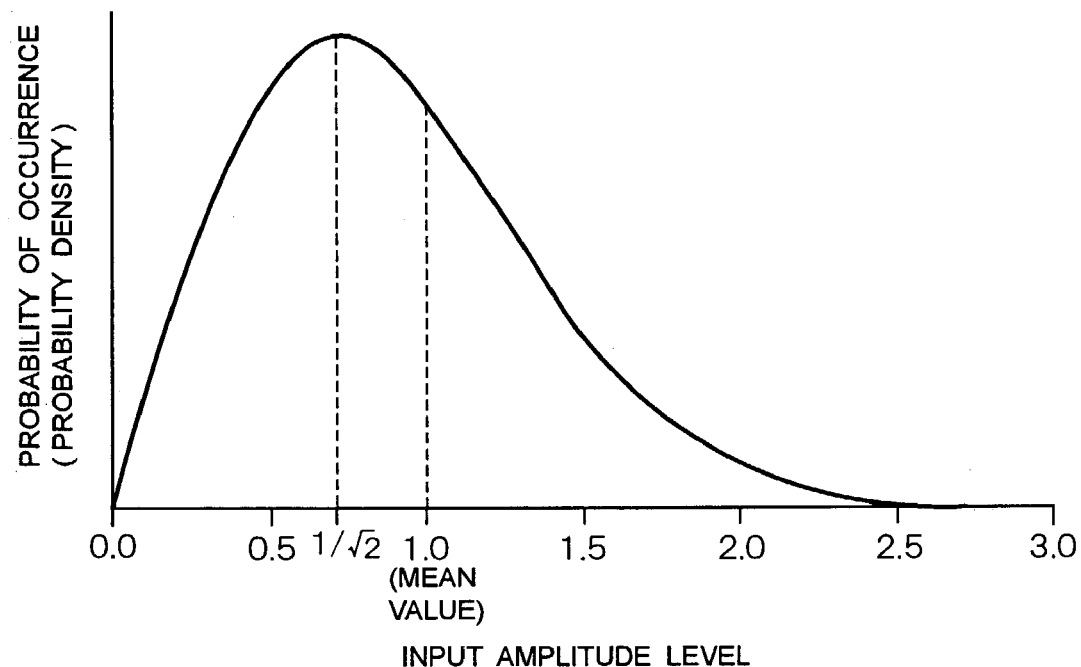
FIG. 2 is a diagram showing an envelop function of a Rayleigh distribution with respect to input amplitude levels.

FIG. 2 is a diagram showing an envelop function (probability density function) of a Rayleigh distribution with respect to input amplitude levels normalized by assuming that the mean amplitude value is 1. As shown in FIG. 2, the probability of occurrence of amplitude components existing in the envelop of an input signal becomes lower as the amplitude is increased if the mean value is 1, the probability of occurrence peaking at $(½)^{1/2}$. In a region where large amplitude compensation is required due to nonlinearity of the power amplifier, the number of error data samples is small because of an extremely low probability of occurrence and a certain length of time is required for waiting for the completion of convergence of compensation data.

Figure 3:
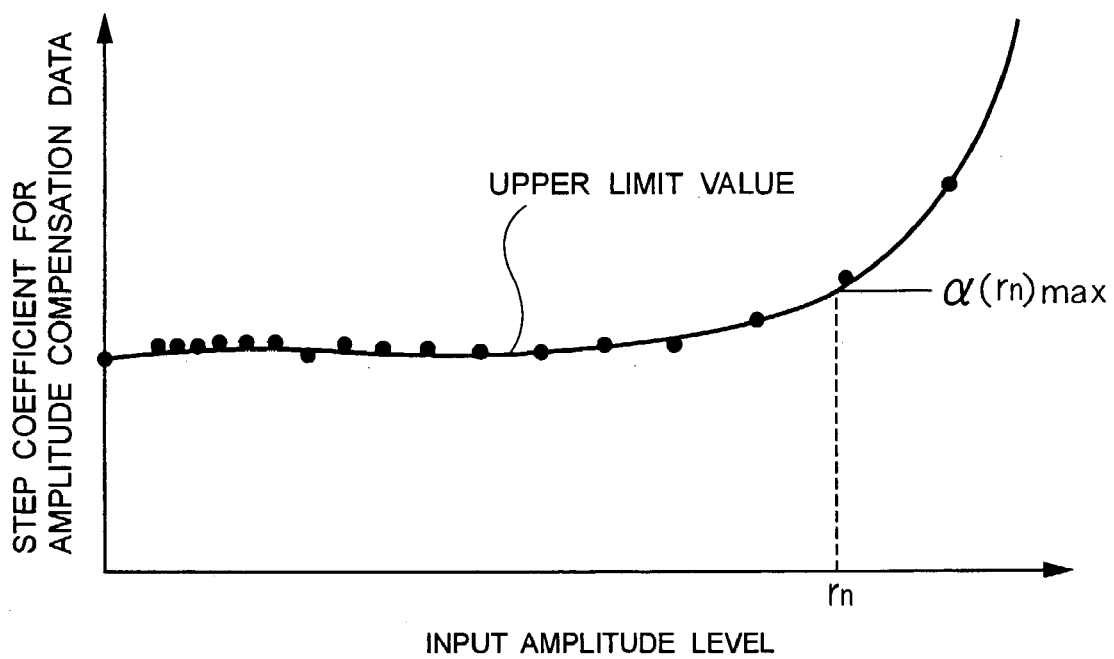
FIG. 3 is a diagram showing, with respect to input amplitude levels, an upper limit value of an amplitude compensation data step coefficient satisfying a condition for stable convergence of amplitude compensation data by computation repeated a limited number of times.

FIG. 3 is a diagram showing, with respect to input amplitude levels, an upper limit value of an amplitude compensation data step coefficient satisfying a condition for stable convergence of amplitude compensation data in repeated computation processing when the number of times computation is repeated is limited to a certain number. If the step coefficient is equal to or smaller than an upper limit value $α(r_n)$max with respect to a certain amplitude $r_n$, compensation data converges with stability by computation repeated at least a certain number of times. However, if the step coefficient is excessively small, the time before the completion of convergence is increased. If the step coefficient is set to a value larger than the upper limit value $α(r_n)$max with respect to the amplitude $r_n$, compensation data vibrates instead of converging with stability. That is, it can be understood that in a case where the convergence time is minimized in which compensation data converges with stability, the step coefficient may be set to the upper limit value $α(r_n)$max. Since the upper limit value αmax varies depending on the input amplitude level as shown in FIG. 3, it is effective to change the step coefficient with respect to the input signal amplitude value without setting the step coefficient to a fixed value in reducing the convergence time while improving the stability of distortion compensation.

As described above, in the distortion compensation circuit according to this embodiment, optimum step coefficients related to different amplitude values are stored in advance in the step coefficient data memory 15 in correspondence with the amplitude values, and updating of the contents in the distortion compensation data memory is performed by using step coefficients $\alpha(r_n)$ and $\beta(r_n)$ (optimum step coefficients) according to the input signal amplitude value $r_n$ computed by the amplitude computation section 10, thus enabling distortion compensation data to converge in the shortest time with stability without vibrating to impair the stability.

Figure 4:
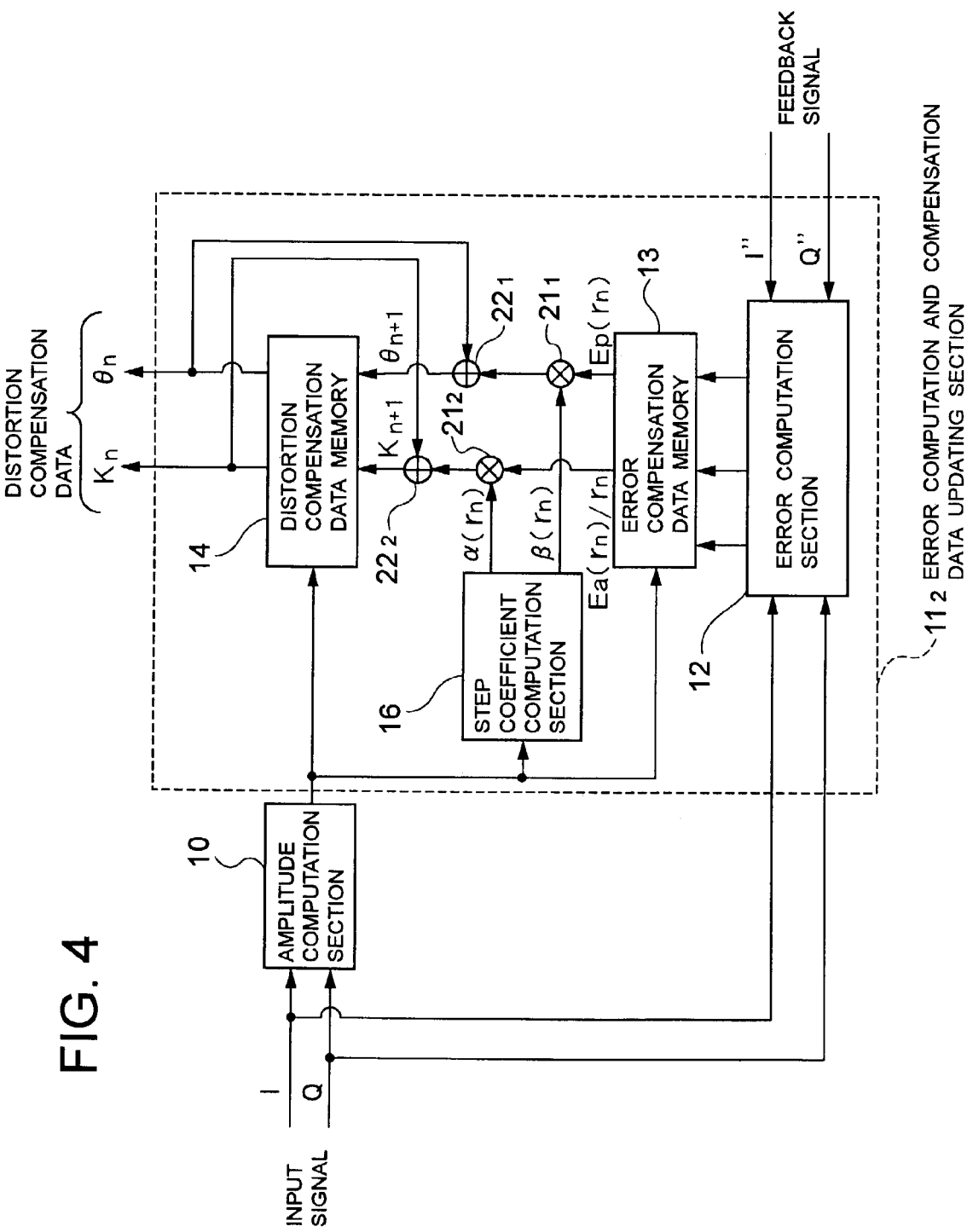
FIG. 4 is a block diagram showing a configuration of an error computation and compensation data updating section $11_2$ in a distortion compensation circuit according to a second embodiment of the present invention.

A distortion compensation circuit according to a second embodiment of the present invention will be described. The distortion compensation circuit according to the second embodiment of the present invention is arranged in such a manner that the error computation and compensation data updating section 91 in the conventional distortion compensation circuit shown in FIG. 9 is replaced with an error computation and compensation data updating section 11$_2$ shown in FIG. 4. In FIG. 4, components identical or corresponding to those shown in FIG. 10 are indicated by the same reference characters.

The error computation and compensation data updating section 11$_2$ in the distortion compensation circuit according to the second embodiment of the present invention differs from the error computation and compensation data updating section 11$_1$ shown in FIG. 1 in that the former has a step coefficient computation section 16 in place of the step coefficient data memory 15.

The step coefficient computation section 16 computes step coefficients $\alpha(r_n)$ and $\beta(r_n)$ corresponding to the amplitude value $r_n$ computed by the amplitude computation section 10 by using an approximation equation having the input signal amplitude value $r_n$ as a variable, and outputs the computed step coefficients $\alpha(r_n)$ and $\beta(r_n)$ to the multipliers 21$_1$ and 21$_2$.

In the distortion compensation circuit according to the first embodiment, step coefficients $\alpha(r_n)$ and $\beta(r_n)$ corresponding to the input signal amplitude value $r_n$ are read out from the step coefficient data memory 15 to be used for computation of amplitude compensation data $K_{n+1}$ and phase compensation data $\theta_{n+1}$. In the distortion compensation circuit according to the second embodiment, the step coefficient computation section 16 computes step coefficients corresponding to the amplitude value $r_n$ from the amplitude computation section 10 by using, for example, an approximation equation or the like having the input signal amplitude value $r_n$ as a variable. Computation for distortion compensation on digital orthogonal baseband signals I and Q, which are input signals, is performed in the same manner as that in the distortion compensation circuit according to the first embodiment.

Figure 5:
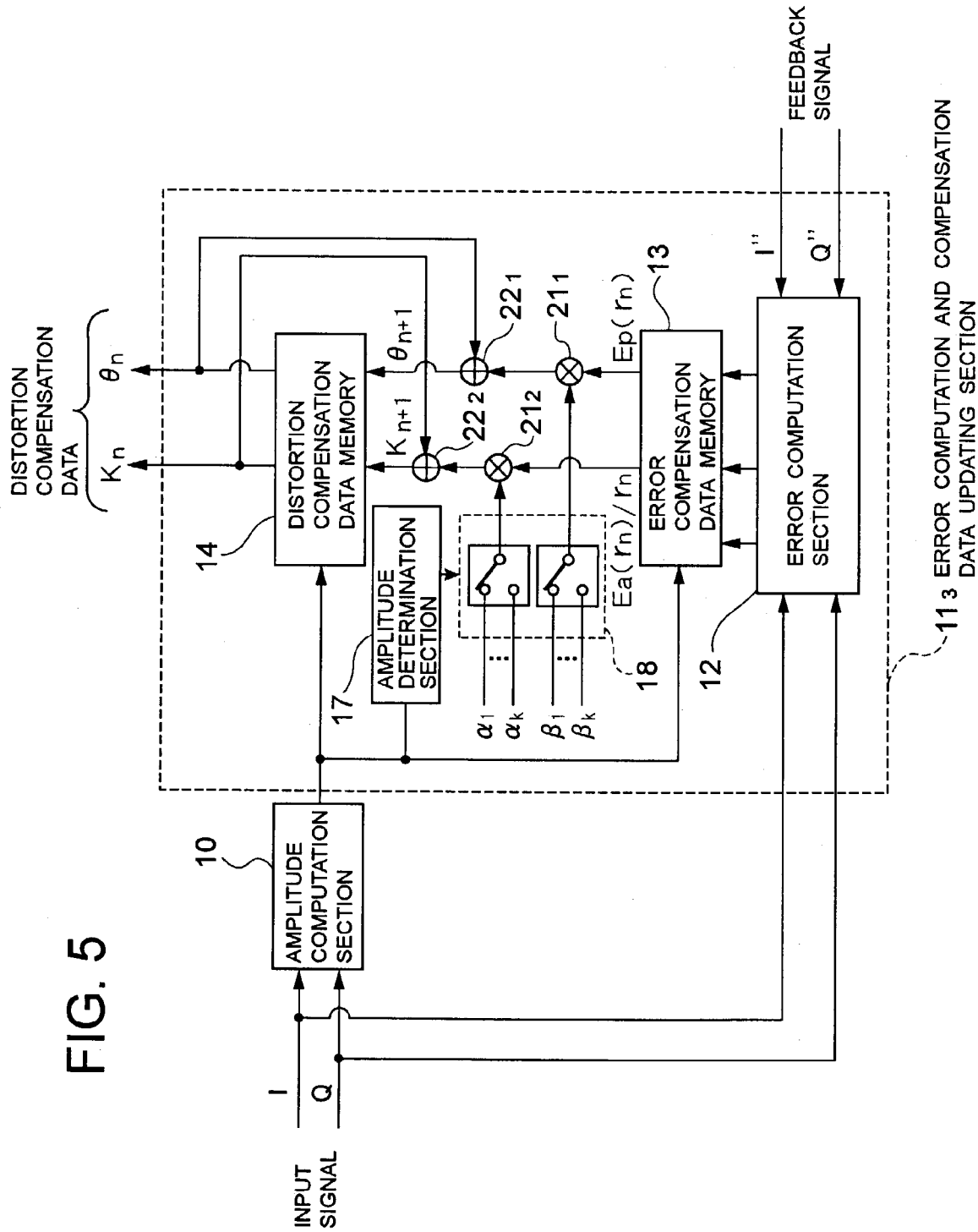
FIG. 5 is a block diagram showing a configuration of an error computation and compensation data updating section $11_3$ in a distortion compensation circuit according to a third embodiment of the present invention.

A distortion compensation circuit according to a third embodiment of the present invention will be described. The distortion compensation circuit according to the third embodiment of the present invention is arranged in such a manner that the error computation and compensation data updating section 91 in the conventional distortion compensation circuit shown in FIG. 9 is replaced with an error computation and compensation data updating section 11$_3$ shown in FIG. 5. In FIG. 5, components identical or corresponding to those shown in FIG. 10 are indicated by the same reference characters.

The error computation and compensation data updating section 11$_3$ in the distortion compensation circuit according to the third embodiment of the present invention differs from the error computation and compensation data updating section 11$_1$ shown in FIG. 1 in that the former has an amplitude determination section 17 and a selector 18 in place of the step coefficient data memory 15.

The amplitude determination section 17 compares the input signal amplitude value $r_n$ computed by the amplitude computation section 10 with at least one amplitude threshold value set in advance. The selector 18 selects, on the basis of the result of comparison in the amplitude determination section 17, one of amplitude compensation data step coefficients ($\alpha_1, \alpha_2, \ldots, \alpha_k$) and one of phase compensation data step coefficients ($\beta_1, \beta_2, \ldots, \beta_k$), and outputs the selected step coefficients to the multipliers 21$_1$ and 21$_2$.

The step coefficients are set so that $\alpha_1 < \alpha_2 < \ldots \leq \alpha_k$, and $\beta_1 < \beta_2 < \ldots \leq \beta_k$. In these inequalities, k is an integer equal to or larger than 2. The threshold value and each step coefficient are set to optimum values which are selected, for example, on the basis of the results of analysis shown in FIG. 2 to reduce the convergence time and to improve the stability.

In the distortion compensation circuit according to the first embodiment, step coefficients $\alpha$ and $\beta$ corresponding to each input signal amplitude value are stored in the step coefficient data memory 15. In the third embodiment, one of at least two step coefficients ($\alpha_1, \alpha_2, \ldots, \alpha_k$) and one of at least two step coefficients ($\beta_1, \beta_2, \ldots, \beta_k$) are selected according to the input signal amplitude value $r_n$ to be used.

For example, if k=2, one amplitude threshold value is set in advance. If the amplitude value $r_n$ from the amplitude computation section 10 is smaller than the threshold value set in advance, step coefficients $\alpha_1$ and $\beta_1$ are used. If the amplitude value $r_n$ is equal to or larger than the threshold value set in advance, step coefficients $\alpha_2$ and $\beta_2$ are used. Similarly, two threshold values are set in advance if k=3, and three threshold values are set in advance if k=4.

According to the third embodiment, it is not necessary to set a step coefficient with respect to each of all input signal amplitude values, so that the number of step coefficients to be in advance set is reduced in comparison with the first embodiment.

A distortion compensation circuit according to a fourth embodiment of the present invention will be described.

Figure 6:
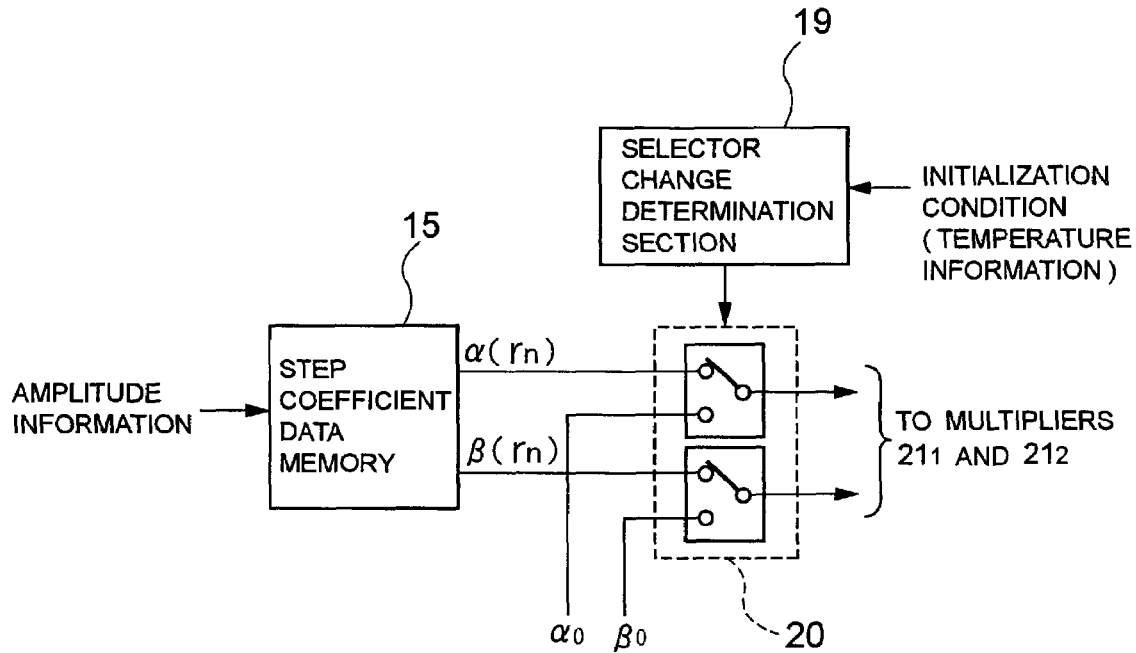
FIG. 6 is a block diagram showing a configuration of an error computation and compensation data updating section in a distortion compensation circuit according to a fourth embodiment of the present invention.

The distortion compensation circuit according to the fourth embodiment of the present invention is arranged in such a manner that the error computation and compensation data updating section 91 in the conventional distortion compensation circuit shown in FIG. 9 is replaced with an error computation and compensation data updating section shown in FIG. 6.

The error computation and compensation data updating section in the distortion compensation circuit according to the fourth embodiment of the present invention is arranged in such a manner that, as shown in FIG. 6, a selector change determination section 19 and a selector 20 are added to the error computation and compensation data updating section 11$_1$ shown in FIG. 1. In FIG. 6, components identical or corresponding to those shown in FIG. 1 are indicated by the same reference characters.

The selector 20 performs switching between step coefficients $\alpha(r_n)$ and $\beta(r_n)$ from the step coefficient data memory 15 and step coefficients $\alpha_0$ and $\beta_0$ set in advance. The selector change determination section 19 controls the selector 20 so that the selector 20 selects step coefficients $\alpha(r_n)$ and $\beta(r_n)$ during a certain time period after initialization or before a temperature equilibrium is reached, and selects step coefficients $\alpha_0$ and $\beta_0$ after a lapse of the certain time period after initialization or after a temperature equilibrium has been reached. The step coefficients are set so that $\alpha_0 \leq \alpha(r_n)$ and $\beta_0 \leq \beta(r_n)$.

During a certain time period after initialization or before a temperature equilibrium is reached, the step coefficients according to the input signal amplitude value are output to the multipliers $21_1$ and $21_2$, as in the first embodiment. On the other hand, after a lapse of the certain time period or after a temperature equilibrium has been reached, it is determined that distortion compensation data has converged and the step coefficients $\alpha_0$ and $\beta_0$ which are smaller than the step coefficients according to the input signal amplitude value are output to the multipliers $21_1$ and $21_2$. In this manner, the stability of distortion compensation after convergence of distortion compensation data can be further improved.

A distortion compensation circuit according to a fifth embodiment of the present invention will be described.

Figure 7:
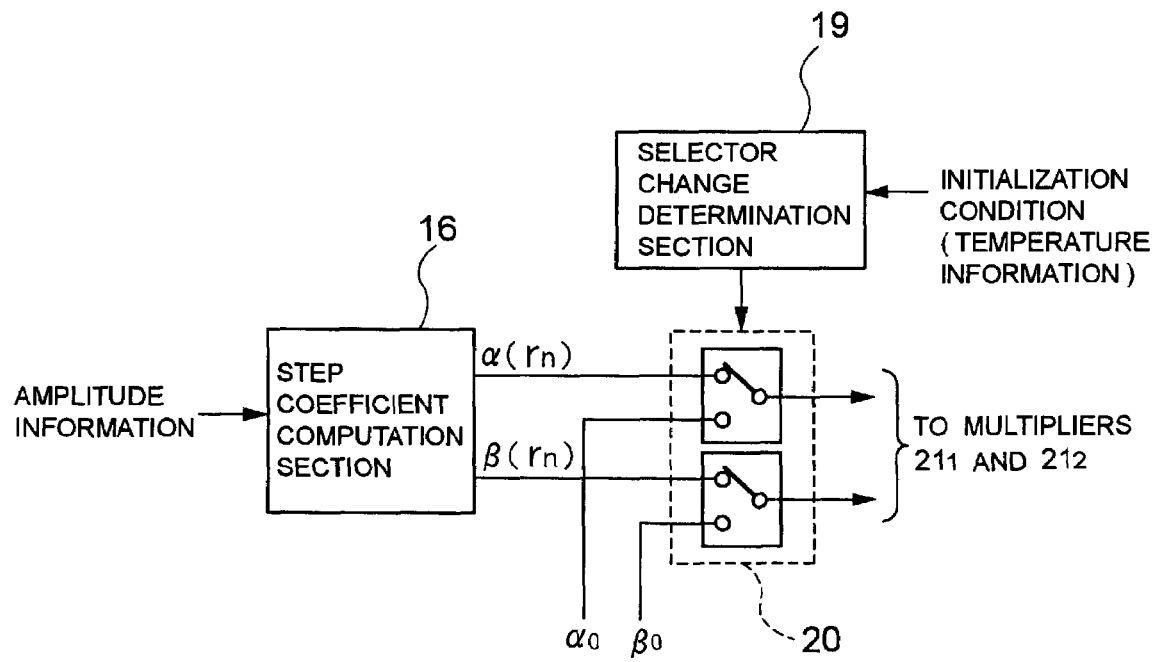
FIG. 7 is a block diagram showing a configuration of an error computation and compensation data updating section in a distortion compensation circuit according to a fifth embodiment of the present invention.

The distortion compensation circuit according to the fifth embodiment of the present invention is arranged in such a manner that the error computation and compensation data updating section 91 in the conventional distortion compensation circuit shown in FIG. 9 is replaced with an error computation and compensation data updating section shown in FIG. 7.

The error computation and compensation data updating section in the distortion compensation circuit according to the fifth embodiment of the present invention is arranged in such a manner that, as shown in FIG. 7, a selector change determination section 19 and a selector 20 are added to the error computation and compensation data updating section $11_2$ shown in FIG. 4. In FIG. 7, components identical or corresponding to those shown in FIGS. 4 and 6 are indicated by the same reference characters.

Referring to FIG. 7, the selector 20 outputs to the multipliers $21_1$ and $21_2$ step coefficients $\alpha(r_n)$ and $\beta(r_n)$ computed by the step coefficient computation section 16 or step coefficients $\alpha_0$ and $\beta_0$ set in advance according to an instruction from the selector change determination section 19.

During a certain time period after initialization or before a temperature equilibrium is reached, the step coefficients according to the input signal amplitude value are output to the multipliers $21_1$ and $21_2$, as in the second embodiment. On the other hand, after a lapse of the certain time period or after a temperature equilibrium has been reached, it is determined that distortion compensation data has converged and the step coefficients $\alpha_0$ and $\beta_0$ which are smaller than the step coefficients according to the input signal amplitude value are output to the multipliers $21_1$ and $21_2$. In this manner, the stability of distortion compensation after convergence of distortion compensation data can be further improved.

Then, a distortion compensation circuit according to a sixth embodiment of the present invention will be described.

Figure 8:
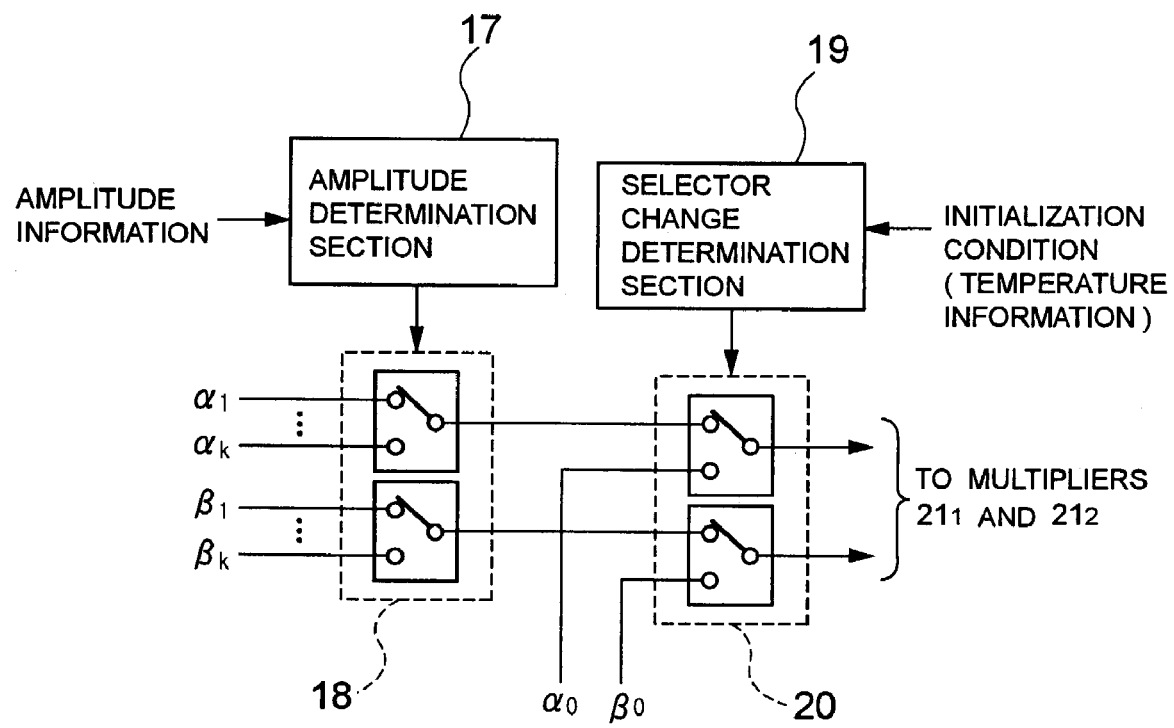
FIG. 8 is a block diagram showing a configuration of an error computation and compensation data updating section in a distortion compensation circuit according to a sixth embodiment of the present invention.

The distortion compensation circuit according to the sixth embodiment of the present invention is arranged in such a manner that the error computation and compensation data updating section 91 in the conventional distortion compensation circuit shown in FIG. 9 is replaced with an error computation and compensation data updating section shown in FIG. 8.

The error computation and compensation data updating section in the distortion compensation circuit according to the sixth embodiment of the present invention is arranged in such a manner that, as shown in FIG. 8, a selector change determination section 19 and a selector 20 are added to the error computation and compensation data updating section $11_3$ shown in FIG. 5. In FIG. 8, components identical or corresponding to those shown in FIGS. 5 and 6 are indicated by the same reference characters.

Referring to FIG. 8, the selector 20 outputs to the multipliers $21_1$ and $21_2$ step coefficients output from the selector 18 on the basis of the result of comparison in the amplitude determination section 17 or step coefficients $\alpha_0$ and $\beta_0$ set in advance according to an instruction from the selector change determination section 19.

During a certain time period after initialization or before a temperature equilibrium is reached, the step coefficients output from the selector 18 on the basis of the result of comparison in the amplitude determination section 17 are output to the multipliers $21_1$ and $21_2$, as in the third embodiment. On the other hand, after a lapse of the certain time period or after a temperature equilibrium has been reached, it is determined that distortion compensation data has converged and the step coefficients $\alpha_0$ and $\beta_0$ which are smaller than the step coefficients output from the selector 18 are output to the multipliers $21_1$ and $21_2$. In this manner, the stability of distortion compensation after convergence of distortion compensation data can be further improved.

Each of the first to sixth embodiments of the present invention has been described above with respect to an application to a predistortion-type distortion compensation circuit. However, the present invention is not limited to the described application, and each embodiment can also be applied to a pre-stage of a Cartesian feedback type of distortion compensation circuit.

The distortion compensation circuit in each of the above-described first to sixth embodiments has step coefficient changing means such as step coefficient data memory 15, step coefficient computation section 16, amplitude determination section 17 and selector 18 and change step coefficients according to the input signal amplitude value. However, according to the present invention, the step coefficient changing means in each of the first to sixth embodiments are not exclusively used and any other means may be used if it is capable of changing the step coefficients to optimum values according to the input signal amplitude value.

As described above, in the error computation and compensation data updating section, step coefficients by which an amplitude error and a phase error computed by comparing a demodulated feedback orthogonal baseband signal and an input orthogonal baseband transmission signal on a polar coordinate system are multiplied are changed according to the amplitude value of the orthogonal baseband transmission signal. Updating of compensation data up to a component of a large input signal amplitude with which only a small number of error data samples are obtained can therefore be performed in a shorter time. Consequently, the time before the completion of convergence of distortion compensation is reduced to a large extent and the stability of distortion compensation is improved.

Also, the step coefficients changed according to the amplitude value of the orthogonal baseband transmission signal are changed to smaller multiplication coefficients after convergence of compensation data, thereby further improving the stability of distortion compensation after convergence of compensation data.

What is claimed is:

1. A distortion compensation circuit comprising:
an amplitude computation section that computes an amplitude value of an orthogonal baseband signal;
an error computation and compensation data updating section that updates distortion compensation data by obtaining an error between the orthogonal baseband transmission signal and a feedback orthogonal baseband signal obtained by demodulating part of an output from an amplification means, and by computing new distortion compensation data by adding, to distortion compensation data before updating, a value obtained by multiplying the obtained error data by a step coefficient; and a nonlinear distortion compensation computation section that compensates for distortion on the orthogonal baseband transmission signal based on the distortion compensation data from said error computation and compensation data updating section, wherein said error computation and compensation data updating section comprises step coefficient changing means for changing the step coefficient according to the amplitude value computed by said amplitude computation section; and wherein said step coefficient changing means comprises:

a step coefficient selector that selects one of at least two step coefficients and outputs the selected step coefficient; and an amplitude determination section that controls a selecting operation of said step coefficient selector according to the amplitude value computed by said amplitude computation section.

2. A distortion compensation circuit comprising:

an amplitude computation section that computes an amplitude value of an orthogonal baseband signal;

an error computation and compensation data updating section that updates distortion compensation data by obtaining an error between the orthogonal baseband transmission signal and a feedback orthogonal baseband signal obtained by demodulating part of an output from an amplification means, and by computing new distortion compensation data by adding, to distortion compensation data before updating, a value obtained by multiplying the obtained error data by a step coefficient; and a nonlinear distortion compensation computation section that compensates for distortion on the orthogonal baseband transmission signal based on the distortion compensation data from said error computation and compensation data updating section, wherein said error computation and compensation data updating section comprises step coefficient changing means for changing the step coefficient according to the amplitude value computed by said amplitude computation section; and wherein said step coefficient changing means comprises a step coefficient data memory that stores a step coefficient with respect to each amplitude value, and that outputs the step coefficient corresponding to the amplitude value computed by said amplitude computation section; and wherein said error computation and compensation data updating section comprises:

selection means for selecting one of the step coefficient from said step coefficient data memory and a step coefficient set in advance to a value smaller than the step coefficient from said step coefficient data memory, and outputting the selected step coefficient; and change determination means for controlling said selection means so that said selection means selects the step coefficient from said step coefficient data memory before convergence of distortion compensation data and selects the step coefficient set in advance after convergence of distortion compensation data.

3. A distortion compensation circuit comprising:

an amplitude computation section that computes an amplitude value of an orthogonal baseband signal;

an error computation and compensation data updating section that updates distortion compensation data by obtaining an error between the orthogonal baseband transmission signal and a feedback orthogonal baseband signal obtained by demodulating part of an output from an amplification means, and by computing new distortion compensation data by adding, to distortion compensation data before updating, a value obtained by multiplying the obtained error data by a step coefficient; and a nonlinear distortion compensation computation section that compensates for distortion on the orthogonal baseband transmission signal based on the distortion compensation data from said error computation and compensation data updating section, wherein said error computation and compensation data updating section comprises step coefficient changing means for changing the step coefficient according to the amplitude value computed by said amplitude computation section; and wherein said step coefficient changing means comprises a step coefficient computation section that computes, by using as a variable the amplitude value computed by said amplitude computation section, a step coefficient corresponding to the amplitude value; and wherein said error computation and compensation data updating section comprises:

selection means for selecting one of the step coefficient from said step coefficient computation section and a step coefficient set in advance to a value smaller than the step coefficient from said step coefficient computation section, and outputting the selected step coefficient; and change determination means for controlling said selection means so that said selection means selects the step coefficient from said step coefficient computation section before convergence of distortion compensation data and selects the step coefficient set in advance after convergence of distortion compensation data.

4. The distortion compensation circuit according to claim 1, wherein said error computation and compensation data updating section comprises:

selection means for selecting one of the step coefficient from said step coefficient selector and a step coefficient set in advance to a value smaller than the step coefficient from said step coefficient selector, and outputting the selected step coefficient; and change determination means for controlling said selection means so that said selection means selects the step coefficient from said step coefficient selector before convergence of distortion compensation data and selects the step coefficient set in advance after convergence of distortion compensation data.

5. The distortion compensation circuit according to claim 2, wherein said change determination means determines that distortion compensation data has converged after a lapse of a certain time period from initialization.

6. The distortion compensation circuit according to claim 2, wherein said change determination means determines that distortion compensation data has converged when a temperature equilibrium is reached.

7. A distortion compensation circuit comprising:

an amplitude computation section that computes an amplitude value of an orthogonal baseband signal;

an error computation and compensation data updating section that updates distortion compensation data by obtaining an error between the orthogonal baseband transmission signal and a feedback orthogonal baseband signal obtained by demodulating part of an output from an amplifier, and by computing new distortion compensation data by adding, to distortion compensation data before updating, a value obtained by multiplying the obtained error data by a step coefficient; and a nonlinear distortion compensation computation section that compensates for distortion on the orthogonal baseband transmission signal based on the distortion compensation data from said error computation and compensation data updating section.

wherein said error computation and compensation data updating section comprises a step coefficient changing circuit that changes the step coefficient based on the amplitude value computed by said amplitude computation section; and wherein said step coefficient changing circuit comprises:

a step coefficient selector that selects one of at least two step coefficients and outputs the selected step coefficient; and an amplitude determination section that controls a selecting operation of said step coefficient selector based on the amplitude value computed by said amplitude computation section.

8. A distortion compensation circuit comprising:

an amplitude computation section that computes an amplitude value of an orthogonal baseband signal;

an error computation and compensation data updating section that updates distortion compensation data by obtaining an error between the orthogonal baseband transmission signal and a feedback orthogonal baseband signal obtained by demodulating part of an output from an amplifier, and by computing new distortion compensation data by adding, to distortion compensation data before updating, a value obtained by multiplying the obtained error data by a step coefficient; and a nonlinear distortion compensation computation section that compensates for distortion on the orthogonal baseband transmission signal based on the distortion compensation data from said error computation and compensation data updating section, wherein said error computation and compensation data updating section comprises a step coefficient changing circuit that changes the step coefficient based on the amplitude value computed by said amplitude computation section;

wherein said step coefficient changing circuit comprises a step coefficient data memory that stores a step coefficient with respect to each of the amplitude values, and that outputs the step coefficient corresponding to the amplitude value computed by said amplitude computation section; and wherein said error computation and compensation data updating section comprises:

a selection circuit that selects one of the step coefficient from said step coefficient data memory and a step coefficient set in advance to a value smaller than the step coefficient from said step coefficient data memory, and outputting the selected step coefficient; and a change determination circuit that controls said selection circuit so that said selection circuit selects the step coefficient from said step coefficient data memory before convergence of distortion compensation data and selects the step coefficient set in advance after convergence of distortion compensation data.

9. A distortion compensation circuit comprising:

an amplitude computation section that computes an amplitude value of an orthogonal baseband signal;

an error computation and compensation data updating section that updates distortion compensation data by obtaining an error between the orthogonal baseband transmission signal and a feedback orthogonal baseband signal obtained by demodulating part of an output from an amplifier, and by computing new distortion compensation data by adding, to distortion compensation data before updating, a value obtained by multiplying the obtained error data by a step coefficient; and a nonlinear distortion compensation computation section that compensates for distortion on the orthogonal baseband transmission signal based on the distortion compensation data from said error computation and compensation data updating section, wherein said error computation and compensation data updating section comprises a step coefficient changing circuit that changes the step coefficient based on the amplitude value computed by said amplitude computation section; and wherein said step coefficient changing circuit comprises a step coefficient computation section that computes, by using as a variable the amplitude value computed by said amplitude computation section, a step coefficient corresponding to the amplitude value; and wherein said error computation and compensation data updating section comprises:

a selection circuit that selects one of the step coefficient from said step coefficient computation section and a step coefficient set in advance to a value smaller than the step coefficient from said step coefficient computation section, and outputs the selected step coefficient; and a change determination circuit that controls said selection circuit so that said selection circuit selects the step coefficient from said step coefficient computation section before convergence of distortion compensation data and selects the step coefficient set in advance after convergence of distortion compensation data.

10. The distortion compensation circuit according to claim 7, wherein said error computation and compensation data updating section comprises:

a selection circuit that selects one of the step coefficient from said step coefficient selector and a step coefficient set in advance to a value smaller than the step coefficient from said step coefficient selector, and outputs the selected step coefficient; and a change determination circuit that controls said selection circuit so that said selection circuit selects the step coefficient from said step coefficient selector before convergence of distortion compensation data and selects the step coefficient set in advance after convergence of distortion compensation data.

11. The distortion compensation circuit according to claim 9, wherein said change determination circuit determines that distortion compensation data has converged after a lapse of time from initialization.

12. The distortion compensation circuit according to claim 9, wherein said change determination circuit determines that distortion compensation data has converged when a temperature equilibrium is reached.

* * * * *